United States Patent
Koizumi et al.

(10) Patent No.: US 6,974,721 B2
(45) Date of Patent: Dec. 13, 2005

(54) METHOD FOR MANUFACTURING THIN SEMICONDUCTOR CHIP

(75) Inventors: Naoyuki Koizumi, Nagano (JP); Kei Murayama, Nagano (JP); Shigeru Mizuno, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/496,690

(22) PCT Filed: Aug. 28, 2003

(86) PCT No.: PCT/JP03/10954

§ 371 (c)(1),
(2), (4) Date: May 26, 2004

(87) PCT Pub. No.: WO2004/030053

PCT Pub. Date: Apr. 8, 2004

(65) Prior Publication Data

US 2005/0176169 A1    Aug. 11, 2005

(30) Foreign Application Priority Data

Sep. 26, 2002  (JP) ............................. 2002-281659

(51) Int. Cl.⁷ ........................ H01L 21/44; H01L 21/48; H01L 21/50
(52) U.S. Cl. ..................................... 438/106; 438/460
(58) Field of Search ........................... 438/48, 68, 106, 438/118, 459, 460, 464

(56) References Cited

U.S. PATENT DOCUMENTS

| | | | |
|---|---|---|---|
| 5,268,065 A | | 12/1993 | Grupen-Shemansky |
| 5,891,298 A | * | 4/1999 | Kuroda et al. ............... 156/344 |
| 6,297,131 B1 | * | 10/2001 | Yamada et al. ............. 438/464 |

FOREIGN PATENT DOCUMENTS

JP    2002-100589    4/2002

* cited by examiner

*Primary Examiner*—Phuc T. Dang
(74) *Attorney, Agent, or Firm*—Staas & Halsey LLP

(57) ABSTRACT

In manufacturing a thin semiconductor chip, a wafer is stably held during processing to maintain a stable shape and to avoid generation of cracks on the wafer. When a thin wafer having a surface thereon is to be processed, a rigid support body is adhered to the other surface of the thin wafer and a ring-shaped frame, encircling an outer periphery of the thin wafer, is adhered to the rigid support body.

2 Claims, 4 Drawing Sheets

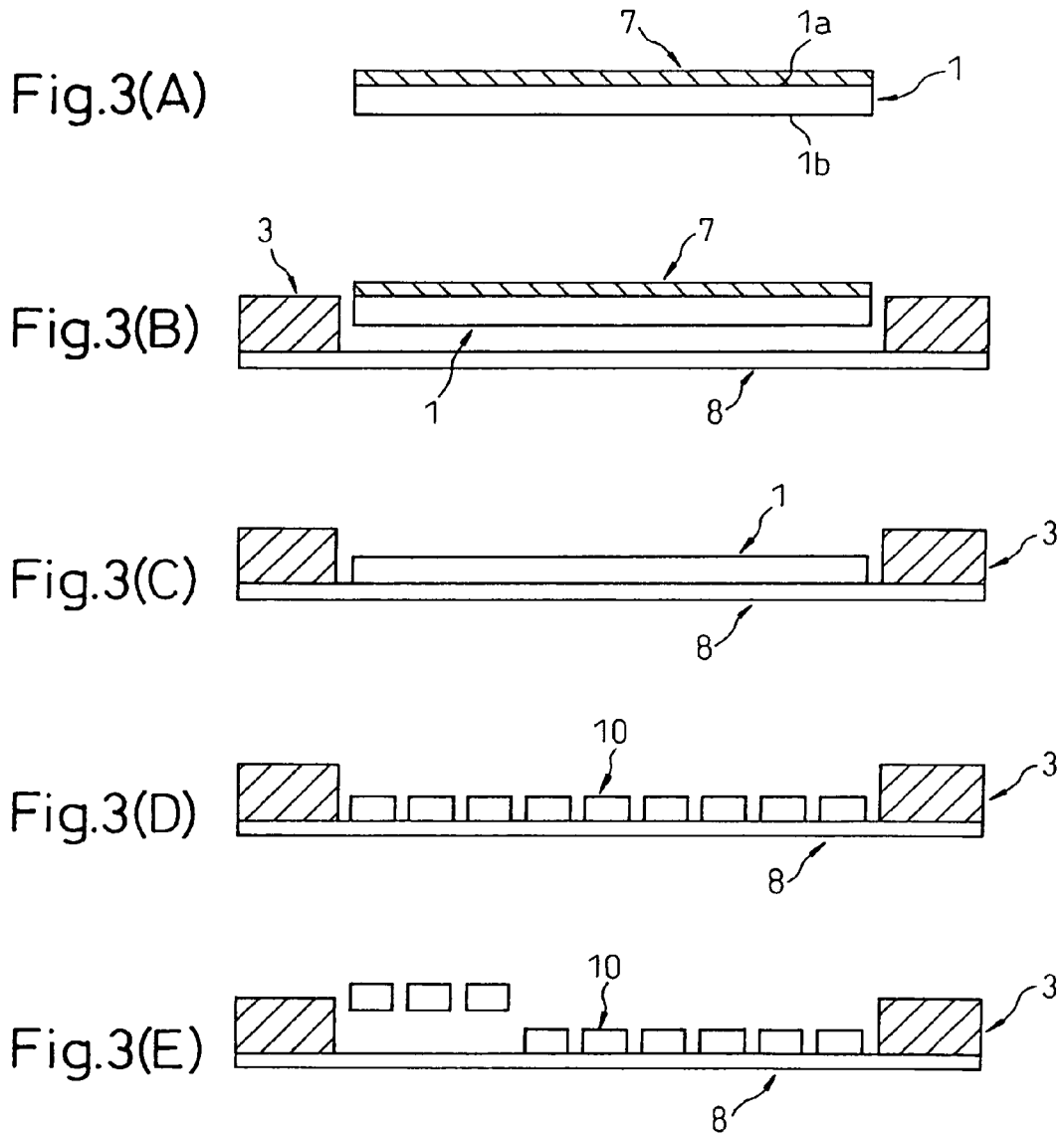

ULTRAVIOLET RAY

METHOD FOR MANUFACTURING THIN SEMICONDUCTOR CHIP

TECHNICAL FIELD

The present invention relates to a method for manufacturing a thin semiconductor chip in which a thin wafer is divided, into individual semiconductor chips, after one of the surfaces of the thin wafer is processed. The method for manufacturing a thin semiconductor chip according to the present invention can be used, for example, when a laser element is formed on a thin substrate of gallium arsenic or a thin substrate of sapphire.

BACKGROUND OF ART

In the prior art, it has been very difficult to process a thin wafer, having a thickness of 100 $\mu$m or less, to form a pattern on the surface of the wafer, to form a film by sputtering or other process, to etch thereon, or to divide the wafer into individual pieces of chips. The reasons are that it has been difficult to stably hold the wafer during these processes, while maintaining the shape and this causes cracks on the wafer and a lack of uniform production due to the deformation of the wafer.

DISCLOSURE OF INVENTION

The present invention was made to overcome the above-mentioned problems and, therefore, the object of the present invention is to provide a method for manufacturing a thin semiconductor chip in which, when the thin wafer is processed, the wafer can be stably held during various processes so as to maintain a stable shape and so that cracks on the wafer and a lack of uniform production, due to the deformation of the wafer, can be avoided.

In order to achieve the above-mentioned object, according to the present invention, there is provided a method of manufacturing a thin semiconductor chip from a thin wafer, having one of the surfaces thereof processed, the method comprising: adhering a rigid support body to the other surface of the thin wafer and adhering a ring-shaped frame, encircling an outer periphery of the thin wafer, to the rigid support body.

A double-side adhesive tape is used to adhere the rigid support body, the thin wafer and the ring-shaped-frame.

According to another aspect of the present invention there is provided a method of manufacturing a thin semiconductor chip, the method comprising: adhering a protective tape to a circuit forming surface of a thin wafer; adhering the thin wafer, at a surface opposite to the circuit forming surface thereof, to a dicing tape and adhering a ring-shaped frame encircling the outer periphery of the thin wafer to the dicing tape; peeling the protective tape off; dicing the thin wafer from a side of the circuit forming surface thereof to divide the thin wafer into a plurality of pieces of individual thin chips; and picking up the individual thin chips.

According to still another aspect of the present invention there is provided a method of manufacturing a thin semiconductor chip, the method comprising: a. adhering a protective tape to a circuit forming surface of a thin wafer; b. adhering the thin wafer at a side of the protective tape to a first tape and adhering a first ring-shaped frame encircling an outer periphery of the thin wafer to the first tape; c. forming a back electrode on a surface of the thin wafer opposite to the circuit forming surface; d. forming a resist pattern on the back electrode; e. etching along the resist pattern to divide the back electrode and the thin safer into individual thin chips; f. removing the resist pattern; g. adhering the thin wafer at a side of the back electrode thereof to a second tape and adhering a second ring-shaped frame encircling an outer periphery of the first ring-shaped frame to the second tape; h. irradiating ultraviolet light onto a side of the first tape in such a manner that an adhesive force, between the protective tape and the thin chips, is reduced to separate the protective tape, the first tape and the first ring-shaped frame from the thin wafer; and i. picking up the individual thin chips.

According to a further aspect of the present invention there is provided a method of manufacturing a thin semiconductor chip, the method comprising: a. adhering a protective tape to a circuit forming surface of a thin wafer; b. adhering the thin wafer at a side opposite to the protective tape to a first tape and adhering a second ring-shaped frame, encircling an outer periphery of the thin wafer with a gap, to the first tape; c. peeling the protective tape off; d. adhering a first ring-shaped frame, encircling an outer periphery of the thin wafer and being accommodated in an inner periphery of the second ring-shaped frame, to the first tape and adhering a second tape to the circuit forming surface of the thin wafer and to the first ring-shaped frame; e. removing the first tape and the second ring-shaped frame from the thin wafer and, then, forming a back electrode on a surface of the thin wafer opposite to the circuit forming surface; f. forming a resist pattern on the back electrode; g. etching along the resist pattern to divide the back electrode and the thin wafer into individual thin chips; h. removing the resist pattern; i. adhering the thin wafer at a side of the back electrode thereof to a second tape and adhering a second ring-shaped frame encircling an outer periphery of the first ring-shaped frame to the second tape; j. irradiating ultraviolet light onto a side of the first tape in such a manner that an adhesive force between the protective tape and the thin chips is reduced to separate the protective tape, the first tape and the first ring-shaped frame from the thin wafer; and k. picking up the individual thin chips.

BRIEF DESCRIPTION OF THE DRAWINGS

FIGS. 3(A) to 3(E) show a third embodiment of a method for manufacturing a thin semiconductor chip of this invention;

BEST MODE FOR CARRYING OUT THE INVENTION

Embodiments of the present invention will now be described in detail with reference to the drawings.

Figure 1A:
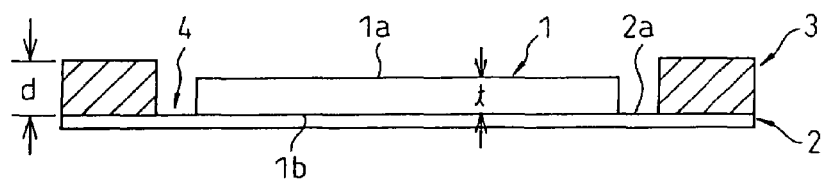
FIGS. 1(A) to 1(c) show a first embodiment of a method for manufacturing a thin semiconductor chip of this invention.
Figure 1B:
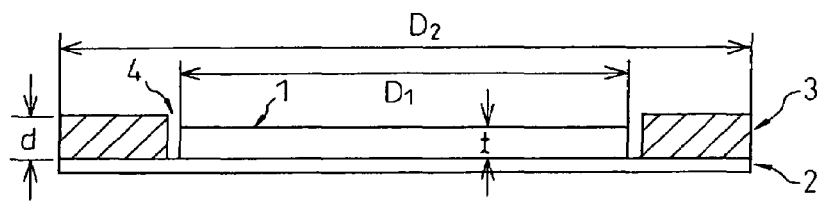
Figure 1C:
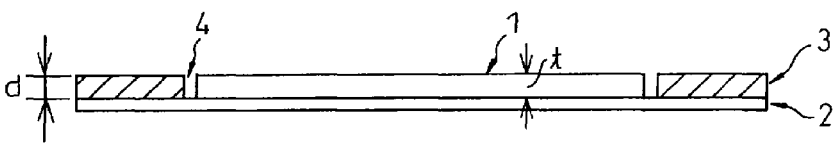

FIGS. 1(A) to 1(c) show a first embodiment of a method for manufacturing a thin semiconductor chip of this invention. A wafer 1 is of a thin disk-like configuration having a diameter (D1) of 6 inches (150 mm) and a thickness (t) of approximately 100 $\mu$m. One of the surfaces of the wafer 1 is a circuit forming surface 1a. To more easily handle the wafer 1, a tape 2 and a ring-shaped frame 3 having relatively strong base are used. One of the surfaces of the tape 2 is an adhesive surface 2a.

FIG. 1(A) shows a type A, in which a ring-shaped frame 3 having an inner diameter larger than the outer diameter of the wafer 1 is used. The upper surface 1a of wafer in FIG. 1 is a circuit forming surface and the opposite surface 1b is adhered to the adhesive surface 2a of the tape 2. The ring-shaped frame 3 is adhered to the adhesive surface 2a of the tape 2 and encircles the outer periphery of the wafer 1. A gap 4 is defined between the outer diameter of the wafer 1 and the inner diameter of the ring-shaped frame 3. The height (d) of the ring-shaped frame 3 is larger than the thickness (t) of the wafer 1.

FIG. 1(B) shows a type B, in which the difference between the outer diameter of the wafer 1 and the inner diameter of the ring-shaped frame 3 is 2 mm or less (the gap 4 therebetween is 1 mm or less). In the same manner as type A, the height (d) of the ring-shaped frame 3 is larger than the thickness (t) of the wafer 1. In the same manner as type A, the surface 1b of the wafer 1 opposite to the circuit forming surface 1a is adhered to the adhesive surface 2a of the tape 2 and the ring-shaped frame 3 is adhered to the adhesive surface 2a of the tape 2 and encircles the periphery of the wafer 1. In this case, a very small gap 4 is defined between the outer diameter of the wafer 1 and the inner diameter of the ring-shaped frame 3.

FIG. 1(C) shows a type C, in which the difference between the outer diameter of the wafer 1 and the inner diameter of the ring-shaped frame 3 is 2 mm or less (the gap 4 therebetween is 1 mm or less), in the same manner as type B. The height (d) of the ring-shaped frame 3 is substantially same as the thickness (t) of the wafer 1. In the same manner as types A and B, the surface 1b of the wafer 1 opposite to the circuit forming surface 1a is adhered to the adhesive surface 2a of the tape 2 and the ring-shaped frame 3 is adhered to the adhesive surface 2a of the tape 2 and encircles the outer periphery of the wafer 1. In this case, a very small gap 4" is defined between the outer diameter of the wafer 1 and the inner diameter of the ring-shaped frame 3 and the thickness (t) of the wafer 1 is the same as the height (d) of the ring-shaped frame 3.

Figure 2A:
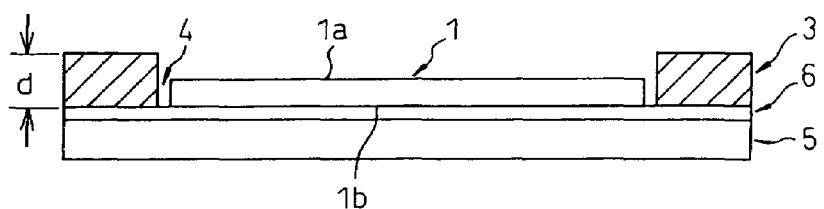
FIGS. 2(A) and 2(B) show a second embodiment of a method for manufacturing a thin semiconductor chip of this invention.
Figure 2B:
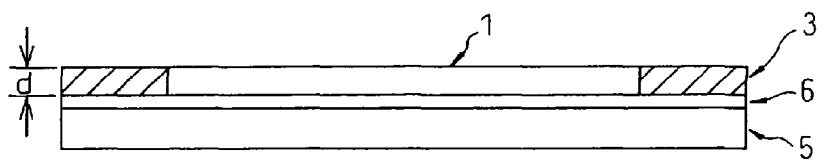
Figure 4A:
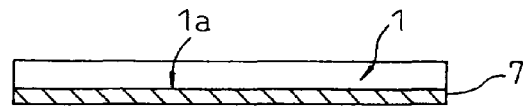
FIGS. 4(A) to 4(J) show a fourth embodiment of a method for manufacturing a thin semiconductor chip of this invention.
Figure 4B:
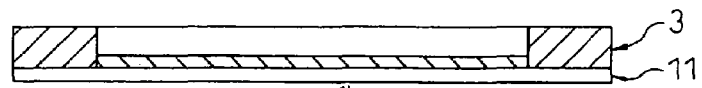
Figure 4C:
Figure 4D:
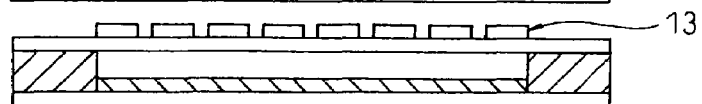
Figure 4E:
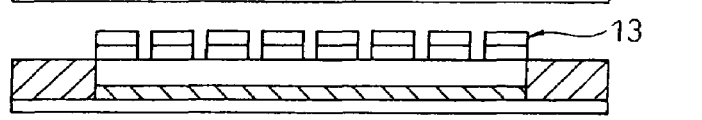
Figure 4F:
Figure 4G:
Figure 4H:
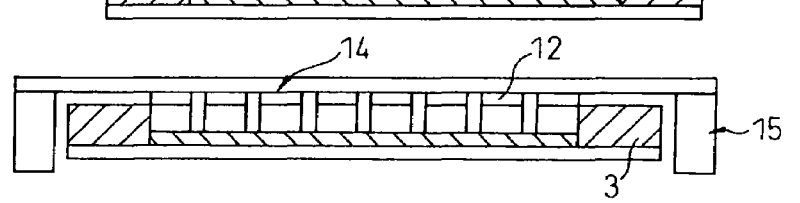
Figure 4I:
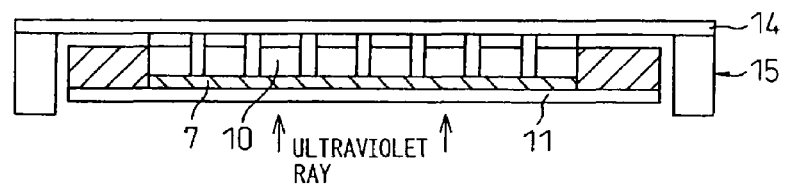
Figure 4J:
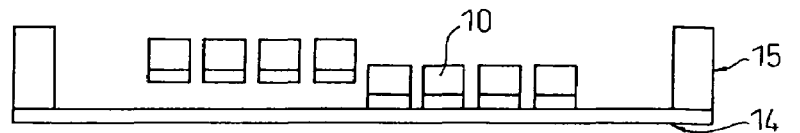
Figure 5A:
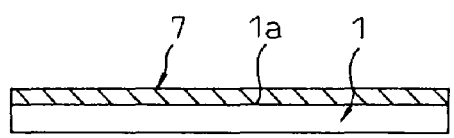
FIGS. 5(A) to 5(E) show a fifth embodiment of a method for manufacturing a thin semiconductor chip of this invention.
Figure 5B:
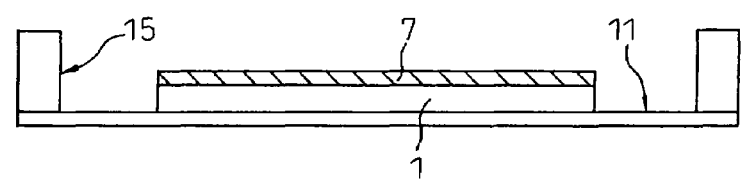
Figure 5C:
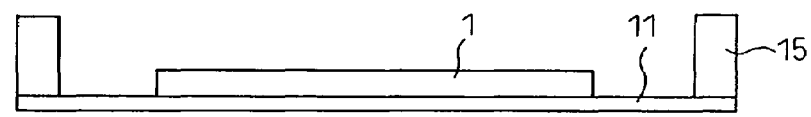
Figure 5D:
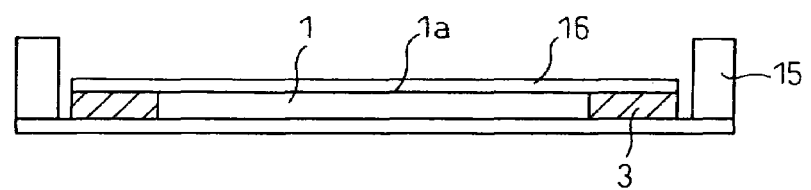
Figure 5E:
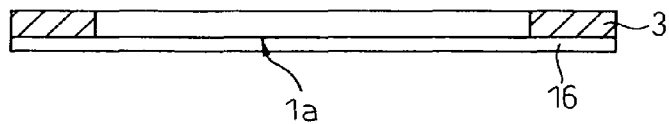

FIGS. 2(A) and 2(B) show a second embodiment of a method for manufacturing a thin semiconductor chip of this invention. In this embodiment, a double-face adhesive tape 6 is adhered to a rigid body 5 and the surface 1b of the wafer opposite to the circuit forming surface 1a is adhered to the double-face adhesive tape 6. In addition, a ring-shaped frame 3 is adhered to the double-face adhesive tape 6 and encircles the outer periphery of the wafer 1. The wafer 1 itself is the same as that used in the previous embodiments.

FIG. 2(A) shows a case in which the height (d) of the ring-shaped frame 3 is larger than the thickness (t) of the wafer 1 and FIG. 2(B) shows a case in which the height (d) of the ring-shaped frame 3 is substantially the same as the thickness (t) of the wafer 1.

A rigid body 5 may be a glass, particularly a silica glass, a wafer, a metal, a polymer or the other, which can be selected in relation to a method for peeling it from the double-face adhesive tape 6. The double-face adhesive tape 6 can be selected as one which can be peeled off by irradiating ultraviolet light or can be thermally peeled off. It is advantageous that the double-face adhesive tape 6 is selected from one which can be easily peeled off the rigid body 5 but is highly adhesive to the ring-shaped frame 3.

In these embodiments, the lower surface of the wafer 1 is supported by the rigid body 5 and, therefore, it can easily be applied to a spinner. In addition, as the ring-shaped frame 3 exists, the double-face adhesive tape 6 can be easily peeled off.

FIGS. 3(A) to 3(E) illustrate respective steps A to E in a third embodiment of a method for manufacturing a thin semiconductor chip of this invention. In a step (A), a protective tape 7 is adhered to a circuit forming surface 1a of the thin wafer 1.

Next, in step (B), a dicing tape 8 is adhered to a surface 1b of the thin wafer 1 opposite to the circuit forming surface 1a. The ring-shaped frame 3 is adhered to the dicing tape 8 and encircles the outer periphery of the wafer 1. Although, in general, the dicing tape 8 is usually adhered after the protective tape 7 is peeled off, in this embodiment, after the wafer 1 is held by the dicing tape 8, the protective tape 7 is peeled off. Therefore, it is advantageous that the wafer will rarely be damaged.

Next, in step (C), the protective tape 7 is peeled off. Then in step (D), the thin safer 1 is diced from the side of the circuit forming surface 1a, in such a manner that the thin wafer 1 is divided into individual pieces of semiconductor chips 10. The size of the divided pieces depends upon the particular purpose of the semiconductor chip 10; in general, a desired rectangular-shaped thin chip 10 is obtained by dicing the wafer both in longitudinal and lateral directions. Next, in step (E), the individual pieces of thin chip are picked up.

According to the embodiment shown in FIGS. 3(A) to 3(E), although a generation of cracks on the wafer 1 can be reduced, there are some drawbacks, i.e., processing from the back surface of the wafer, for example, electrode forming, patterning or etching cannot be done.

To solve these problems, the embodiments shown in FIGS. 4 and 5 can advantageously be used.

FIGS. 4(A) to 4(J) relate to a fourth embodiment of the present invention and show the respective steps A to J of a method for manufacturing a thin semiconductor chip using two kinds of ring-shaped frames. First, in step (A), a protective tape 7 is adhered to the circuit forming surface 1a of the thin wafer 1. Next, in step (B), the thin wafer 1 at the side of the protective tape 7 is adhered to a first tape 11. On the other hand, a first ring-shaped frame 3 is adhered to the first tape 11 to encircle the outer periphery of the thin wafer 1.

Next, in step (C), a back electrode 12 is formed on a surface 1b of the thin wafer 1, opposite to the circuit forming surface 1a. The material of the back electrode 12 is Al, Cu, Au or other, formed over the entire surface of the thin wafer 1 and the first ring-shaped frame 3. The back electrode 12 can be formed by sputtering or vapor deposition of a metal, after the surface of the thin wafer 1 opposite to the circuit forming surface 1a is rinsed. Next, in step (D), a resist pattern 13 is formed on the back electrode 12. Next, in step (E), the back electrode 12 is etched along the resist pattern 13 and, in step (F), a layer of the thin wafer 1 is divided by etching into individual pieces of thin chips 10.

Next, in step (G), the resist 13 is removed by an ashing process. Next, in step (H), a second tape 14 is adhered to the thin wafer 1 at the side of back electrode 12. A second, outer ring-shaped frame 15 encircling the outer periphery of the first, inner ring-shaped frame 3 is already adhered to this second tape 14. Next, in step (I), ultraviolet light is irradiated from the side of the first tape 11 to weaken the adhesive force between the protective tape 7 and the thin chip 10 to separate the protective tape 7, the first tape 11 and the first, inner ring-shaped frame 3 from the thin wafer 1. Next, in step (J), the individual thin chips 10 are picked up to obtain separate individual chips 10.

In the embodiment shown in FIGS. 4(A) to 4(J), if the individual thin chips 10 are directly picked up in the step (G), the circuit forming surface of the thin chip 10 might be damaged when separating it from the protective tape 7. Therefore, the above-mentioned method should adopted. Otherwise, if a pick-up method which involves no such problems can be adopted, it is possible to omit step (H) and subsequent steps, after the individual thin chips 10 are picked up in step (G).

FIGS. 5(A) to 5(E) show a fifth embodiment of this invention, i.e., a method for manufacturing a thin semiconductor chip in which the protective tape is peeled off before the support body is adhered. First, in step (A), a protective tape 7 is adhered to the circuit forming surface 1a of the thin wafer 1. Next, in step (B), the thin wafer 1 at the surface thereof opposite to the surface thereof on which the protective tape 7 is adhered, is adhered to a first tape 11. An outer, ring-shaped frame 15, encircling the outer periphery of the thin wafer 1 with a gap therebetween, is already adhered to this first tape 11. Next, in step (C), the protective tape 7 is peeled off. Next, in step (D), an inner ring-shaped frame 3, encircling the outer periphery of the thin wafer 1 and accommodated within the inner periphery of the outer ring-shaped frame 15, is adhered to the first tape 11 and a second tape 16, which is abutted to the inner ring-shaped frame 3, is adhered to the circuit forming surface 1a of the thin wafer 1. In this embodiment, the outer and inner ring-shaped frame 15 and 13 are in the same spatial relationship but are processed in the reverse order relatively to those same frames 15 and 13 in the fourth embodiment. Next, in step (E), the first tape 11 and the outer ring-shaped frame 15 are removed. As the subsequent steps in this embodiment, the step (C) in FIG. 4C and the subsequent steps thereof can be adopted. In this embodiment, if there are no problems in directly picking up the thin chips 10, the step (H) and the subsequent steps thereof in FIG. 4 can be omitted.

It should be understood by those skilled in the art that the foregoing description relates to only preferred embodiments of the disclosed invention, and that various embodiments, changes and modifications may be made to the invention without departing the sprit and scope thereof. The present invention can be applied to various size of wafer, such as an 8-inch wafer or a 6-inch wafer.

As described above, according to the present invention, when a thin wafer is processed, the wafer can be maintained in a stable state during various steps so that cracks or deformation in the thin wafer and a good productivity of thin semiconductor chips can be obtained and, also, the production efficiency can be improved.

What is claimed is:

1. A method of manufacturing a thin semiconductor chip, comprising:
   adhering a protective tape to a circuit forming surface of a thin wafer;
   adhering said protective tape, and thereby said thin wafer, to a first tape and adhering an inner ring-shaped frame, encircling an outer periphery of the thin wafer, to said first tape;
   forming a back electrode on a surface of the thin wafer opposite to the circuit forming surface;
   forming a resist pattern on said back electrode;
   etching along said resist pattern to divide said back electrode and said thin wafer into individual thin chips;
   removing said resist pattern;
   adhering said individual thin chips to a second tape and adhering an outer ring-shaped frame, encircling an outer periphery of the first ring-shaped frame, to said second tape;
   irradiating ultraviolet light onto a side of said first tape thereby to reduce an adhesive force between said protective tape and said thin chips and facilitate separating said protective tape, said first tape and said inner ring-shaped frame from said thin chips; and
   picking up said individual thin chips.

2. A method of manufacturing a thin semiconductor chip, said method comprising:
   adhering a protective tape to a circuit forming surface of a thin wafer;
   adhering said thin wafer at a surface thereof, opposite to the circuit forming surface thereof adhered to the protective tape, to a first tape and adhering a first outer ring-shaped frame, encircling an outer periphery of the thin wafer with a gap therebetween, to said first tape;
   peeling said protective tape off the circuit forming surface;
   adhering an inner ring-shaped frame, encircling an outer periphery of the thin wafer and accommodated within an inner periphery of the first outer ring-shaped frame, to said first tape and adhering a second tape to the circuit forming surface of the thin wafer and to said inner ring-shaped frame;
   removing said first tape and said outer ring-shaped frame from the thin wafer and, then, forming a back electrode on a surface of the thin wafer opposite to the circuit forming surface thereof;
   forming a resist pattern on said back electrode;
   etching along said resist pattern to divide said back electrode and said thin wafer into individual thin chips;
   removing said resist pattern;
   adhering said individual thin chips to a third tape and adhering an outer ring-shaped frame, encircling an outer periphery of the inner ring-shaped frame, to said third tape;
   irradiating ultraviolet light onto a side of said second tape thereby to reduce an adhesive force between said second tape and individual said thin chips separate and facilitate separating said second tape and said inner ring-shaped frame from said individual thin chips; and
   picking up said individual thin chips.

\* \* \* \* \*